(12) United States Patent
Zheng et al.

(10) Patent No.: US 9,967,049 B2
(45) Date of Patent: May 8, 2018

(54) TEMPERATURE-INSENSITIVE OPTICAL TRANSCEIVER

(71) Applicant: Oracle International Corporation, Redwood Shores, CA (US)

(72) Inventors: Xuezhe Zheng, San Diego, CA (US); Ashok V. Krishnamoorthy, San Diego, CA (US)

(73) Assignee: Oracle International Corporation, Redwood Shores, CA (US)

(*) Notice: Subject to any disclaimer, the term of this patent is extended or adjusted under 35 U.S.C. 154(b) by 205 days.

(21) Appl. No.: 15/141,452

(22) Filed: Apr. 28, 2016

(65) Prior Publication Data

US 2017/0353262 A1    Dec. 7, 2017

(51) Int. Cl.

| H04J 14/02 | (2006.01) |
|---|---|
| H04J 14/06 | (2006.01) |
| G02B 6/10 | (2006.01) |
| G02B 6/27 | (2006.01) |
| G02F 1/01 | (2006.01) |
| G02B 6/12 | (2006.01) |
| H01L 31/101 | (2006.01) |

(52) U.S. Cl.
CPC .......... *H04J 14/0204* (2013.01); *G02B 6/102* (2013.01); *G02B 6/12009* (2013.01); *G02B 6/2773* (2013.01); *G02F 1/0147* (2013.01); *H01L 31/1013* (2013.01); *H04J 14/06* (2013.01)

(58) Field of Classification Search
CPC ...... H04J 14/06; H04J 14/0204; G02B 6/102; G02B 6/2773; G02B 6/12009; G02F 1/0147; H04B 10/11; H04B 10/152; H04B 10/00; H01L 31/1013
See application file for complete search history.

(56) References Cited

U.S. PATENT DOCUMENTS

| 9,285,539 B2 | 3/2016 | Zheng et al. | |
| 2004/0037530 A1* | 2/2004 | Ohtsu ............ | B29D 11/00663 385/129 |
| 2004/0069984 A1* | 4/2004 | Estes ................. | B82Y 10/00 257/25 |

OTHER PUBLICATIONS

Choudhury et al.; "Ultrafast laser inscription: perspectives on future integrated applications"Laser Photonics Rev., 1-20 (2014) / DOI 10.1002/lpor.201300195.

(Continued)

*Primary Examiner* — Ted Wang
(74) *Attorney, Agent, or Firm* — Park, Vaughan, Fleming & Dowler LLP (57) ABSTRACT

A transceiver separates wavelength-division-multiplexing (WDM) components into two groups, one of which is more sensitive to temperature than the other group. The temperature-sensitive group of optical components is implemented on a first substrate in the transceiver that has a lower thermo-optic coefficient than a second substrate in the transceiver, which contains the group of optical components that is less temperature sensitive. In particular, the first substrate, which may be glass, may include WDM components that convey optical signals having multiple carrier wavelengths. Moreover, the second substrate, such as a silicon substrate (e.g., a silicon-on-insulator platform), may include multiple parallel optical paths with optical components, in which a given optical path conveys an optical signal having a given carrier wavelength.

20 Claims, 5 Drawing Sheets

(56) References Cited

OTHER PUBLICATIONS

Optoscribe; Welcome to Optoscribe 3D waveguide technology for optical communications, downloaded from http://www.optoscribe.com/, Jan. 5, 2017.
Zakynthinos et al.; "Integrated Transceivers for Flexible Terabit Networks" IEEE photonics Society News Feb. 2014, vol. 28, No. 1, www.PhotonicsSociety.org.

* cited by examiner

TEMPERATURE-INSENSITIVE OPTICAL TRANSCEIVER

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure generally relates to the design of an optical transceiver. More specifically, the present disclosure relates to the design of an optical transceiver with reduced temperature sensitivity.

Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range. However, there are several practical challenges in implementing wavelength-division-multiplexing (WDM) silicon-photonic interconnects, especially for long optical fiber links.

One challenge for WDM silicon-photonic interconnects is the wavelength accuracy and stability of the silicon-based WDM components. In particular, because silicon optical waveguides are small and have a high index-of-refraction contrast, very compact WDM passive components (such as arrayed-waveguide gratings, echelle gratings and ring resonators) can be made on silicon-on-insulator (SOI) platforms. However, silicon-based WDM components that include small silicon optical waveguides with high confinement are typically sensitive to manufacturing tolerances. Consequently, the absolute wavelength accuracy of silicon-based WDM components usually cannot be guaranteed. In addition, because the thermo-optic coefficient of silicon is quite large (approximately $1.8 \times 10^{-4}$/K), the wavelength of the silicon-based WDM components are also usually sensitive to ambient temperature change (e.g., approximately 0.9 nm/K). Given that tens of degrees of temperature variation is typical in a real system, temperature (or wavelength) tuning and control are usually necessary for silicon-based WDM components in a WDM link.

Moreover, a second challenge for WDM silicon-photonic interconnects is the limited optical bandwidth of the surface normal input/output (I/O) optical couplers, such as silicon grating couplers. In principle, a grating coupler is an I/O device that bridges a sub-micron silicon optical waveguide mode to larger single-mode optical fiber mode (approximately a 10 μm mean fiber diameter) with low optical coupling loss and surface-normal coupling. Surface-normal optical coupling via grating couplers also enables wafer-scale testing of silicon photonic devices/circuits, which is often desirable for low-cost manufacturing. However, silicon grating couplers usually have a limited optical bandwidth (typically, around 30 nm). Manufacturing tolerances also usually result in a few nanometers of center-wavelength offset, which further reduces the usable bandwidth. Consequently, for a given channel spacing, the number of WDM channels is often limited.

Furthermore, a third challenge for WDM silicon-photonic interconnects is polarization diversity. Although a known polarization state is launched into an optical fiber at the transmitter, the polarization state at the receiver can be arbitrary after propagation in a single-mode optical fiber over some distance. Because of the large index-of-refraction difference between the transverse electric and the transverse magnetic mode of thin SOI optical waveguides, silicon-photonic devices on a sub-micron SOI platform are typically designed to only support transverse-electric polarization. Consequently, polarization diversity is typically necessary at the receiver in order to receive optical signals properly.

For example, a polarization-splitting grating coupler (PSGC) can couple an input from an optical fiber with arbitrary polarization into two transverse-electric optical waveguides on SOI. Two identical copies of wavelength demultiplexers may then be used to separate the wavelength channels for these two components. Moreover, the signals for the separated wavelength channels may be subsequently combined at photodetectors. An arrayed-waveguide grating, an echelle grating and/or a ring resonator-based wavelength demultiplexer can be used for such a polarization-insensitive receiver. However, as noted previously, temperature tuning and control are usually needed for these silicon demultiplexers, which often rely on the optical signal power in the silicon optical waveguide before and after the silicon demultiplexer. With an arbitrary and constantly changing polarization input from the optical fiber, the ratio of the optical signal power in the two separate optical paths is typically not fixed. Consequently, sometimes there may even be no power on one of the optical paths. This may be very challenging for tuning and control of the wavelength demultiplexers. In addition, the PSGC optical bandwidth is often even narrower than that of single-polarization grating couplers.

Hence, what is needed is a WDM component without the problems described above.

SUMMARY

One embodiment of the present disclosure provides a transceiver with a first integrated circuit and a second integrated circuit, which is optically coupled to the first integrated circuit. The first integrated circuit includes: a node (such as an optical coupler) that may be optically coupled to one or more optical fibers and surface-normal couplers (such as mirrors) that may be optically coupled to the second integrated circuit; and, between the node and the surface-normal couplers, wavelength-division-multiplexing (WDM) components that convey optical signals having multiple carrier wavelengths. Moreover, the first integrated circuit includes a first substrate having a thermo-optic coefficient that is less than a threshold value. Furthermore, the second integrated circuit includes multiple parallel optical paths with optical components, where a given optical path conveys an optical signal having a given carrier wavelength. Additionally, the second integrated circuit includes a second substrate having a thermo-optic coefficient that is greater than the threshold value.

Note that optical waveguides on the first substrate may be polarization dependent and optical waveguides on the second substrate may support a single polarization.

Moreover, the first substrate may include glass.

Furthermore, the WDM components may include multiplexers, demultiplexers, and optical waveguides. For example, the demultiplexers may be optically coupled to polarization-splitting grating couplers on the second integrated circuit and the multiplexers may be optically coupled to single-polarization grating couplers on the second integrated circuit.

Additionally, the optical components on the second substrate may include: photodetectors, optical waveguides, modulators, the single-polarization grating couplers optically coupled to the modulators and the polarization-splitting grating couplers optically coupled to the photodetectors. Note that the single-polarization grating couplers and the polarization-splitting grating coupler may optical couple to the surface-normal couplers on the first integrated circuit. In some embodiments, the optical components include optical sources and/or power splitters.

In some embodiments, the second integrated circuit includes: the second substrate; a buried-oxide layer disposed on the second substrate; and a semiconductor layer disposed on the buried-oxide layer, where the optical components are defined, at least in part, in the semiconductor layer. For example, the second substrate may include silicon, the buried-oxide layer may include silicon dioxide, and the semiconductor layer may include silicon.

Another embodiment provides a system that includes: a processor; a memory that stores a program module; and the transceiver. During operation, the program module is executed by the processor.

Another embodiment provides a method for transmitting optical signals, which may be performed by the transceiver.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a transceiver, a system that includes the transceiver, and a method for transmitting optical signals are described. This transceiver separates wavelength-division-multiplexing (WDM) components into two groups, one of which is more sensitive to temperature than the other group. The temperature-sensitive group of optical components is implemented on a first substrate in the transceiver that has a lower thermo-optic coefficient than a second substrate in the transceiver, which contains the group of optical components that is less temperature sensitive. In particular, the first substrate, which may be glass, may include WDM components that convey optical signals having multiple carrier wavelengths. Moreover, the second substrate, such as a silicon substrate (e.g., a silicon-on-insulator platform), may include multiple parallel optical paths with optical components, in which a given optical path conveys an optical signal having a given carrier wavelength.

By separating the WDM components into the two groups and using separate optical paths for the different carrier wavelengths on the second substrate, the transceiver can avoid the need for temperature tuning or temperature control while providing wavelength accuracy and stability. Moreover, the transceiver may provide a scalable WDM architecture that is not subject to the bandwidth limit of silicon grating couplers. Consequently, the transceiver may be simpler and may have a lower cost than existing transceivers. Therefore, the transceiver may facilitate high-performance optical interconnects for use in applications such as high-performance computing.

Figure 1:
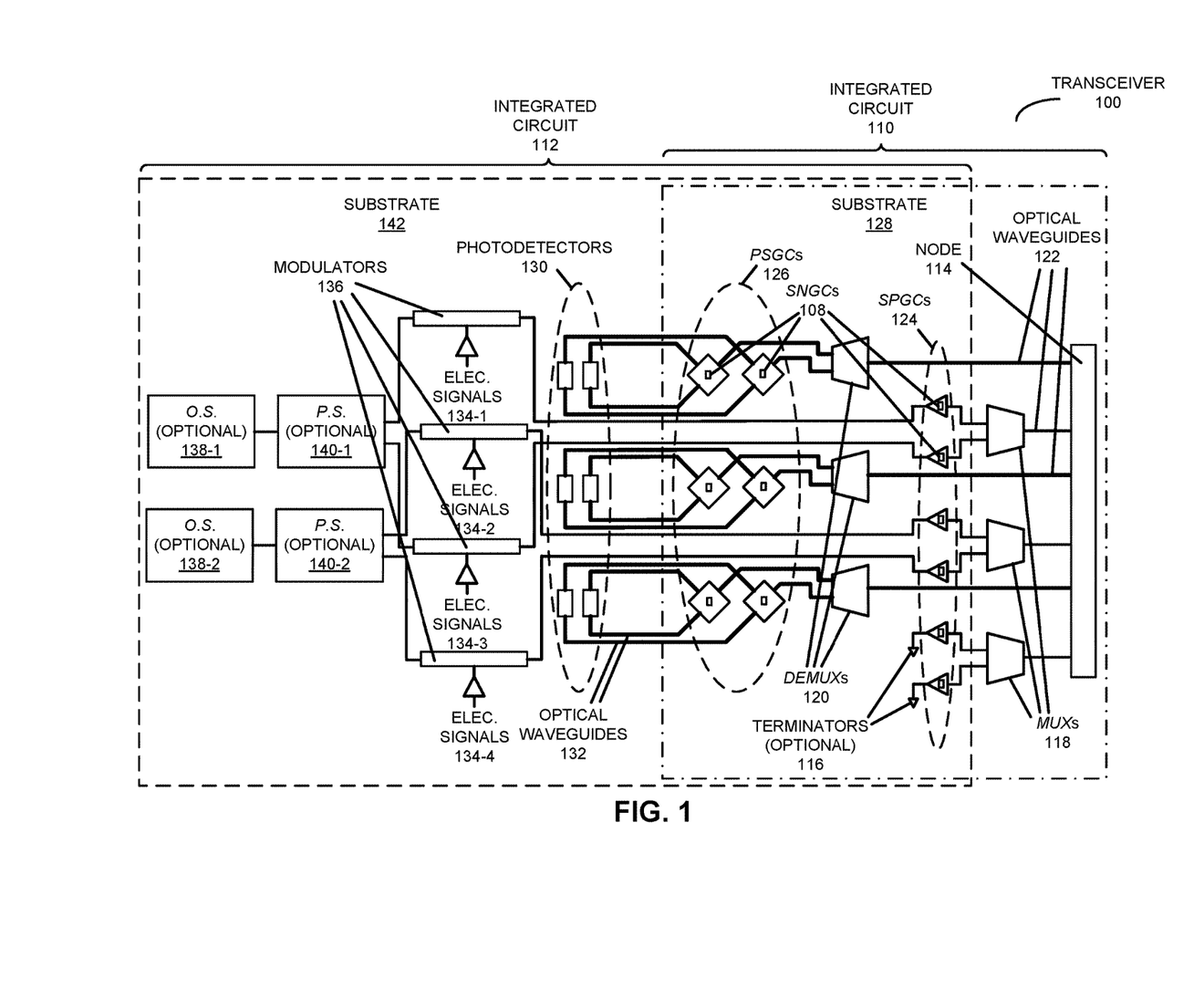
FIG. 1 is a block diagram illustrating a transceiver in accordance with an embodiment of the present disclosure.

We now describe embodiments of the transceiver. FIG. 1 presents a block diagram illustrating a transceiver 100 that includes integrated circuits 110 and 112. These integrated circuits are optically coupled using vertical coupling, such as a vertical-angled technique using angled-facet outputs (and, more generally, surface-normal couplers or SNCs 108) on integrated circuit 110, and additional surface-normal grating couplers on integrated circuit 112. For example, the additional surface-normal grating couplers on integrated circuit 112 may be included in single-polarization grating couplers (SPGCs) 124 and polarization-splitting grating couplers (PSGCs) 126. Thus, in FIG. 1, integrated circuits 110 and 112 may, at least in part, overlap each other.

Integrated circuit 110 includes: a node (or connector) 114 (and, more generally, an optical coupler) that may be optically coupled to one or more optical fibers; surface-normal couplers 108 and WDM components, between node 114 and surface-normal couplers 108, that convey optical signals having multiple carrier wavelengths. For example, WDM components may include multiplexers 118, demultiplexers 120, and optical waveguides 122. In some embodiments, optical waveguides 122 are optically coupled the one or more optical fibers via node 114 and surface-normal optical couplers 108 are optically coupled to single-polarization grating couplers 124 and polarization-splitting grating couplers 126 on integrated circuit 112. Note that some of the inputs that are unused may be coupled to optional terminators 116. As described further below with reference to FIG. 2, integrated circuit 110 includes substrate 128 having a thermo-optic coefficient that is less than a threshold value (such as a thermo-optic coefficient between 2.0 and $9.8 \cdot 10^{-6} K^{-1}$).

Furthermore, integrated circuit 112 may include multiple parallel optical paths with optical components, where a given optical path conveys an optical signal having a given carrier wavelength. For example, the optical components may include: single-polarization grating couplers 124 (optically coupled to multiplexers 118), polarization-sensitive grating couplers 126 (optically coupled to demultiplexers 120), photodetectors 130, optical waveguides 132, and modulators 136 (which modulate the carrier wavelengths in the optical signals based on electrical signals 134). In some embodiments, the optical components include optional optical sources (O.S.) 138 and/or optional power splitters (P.S.) 140. Additionally, integrated circuit 112 includes a substrate 142 having a thermo-optic coefficient that is greater than the threshold value (such as a thermo-optic coefficient of $1.8 \cdot 10^{-4} K^{-1}$). For example, as described further below with reference to FIG. 3, integrated circuit 112 may be a silicon-photonic chip. Consequently, optical waveguides 132 on substrate 142 may be polarization dependent and optical waveguides 122 on substrate 128 may support a single polarization.

In an exemplary embodiment, substrate 128 includes glass. Unlike silicon, very low (orders of magnitude lower) thermo-optic coefficients can be obtained in optical glass materials. When glass with a low thermo-optic coefficient is used, no temperature control may be necessary for integrated circuit 110. Moreover, using a direct laser writing technique based on ultrafast laser inscription (which locally changes the index of refraction), low-index-contrast optical waveguide structures can be written inside a glass blank in three dimensions. In particular, using low-index-contrast glass optical waveguides, passive WDM components (e.g., multiplexers/demultiplexers) can be made with accurate wavelength registration. In addition, using the three-dimensional (3D) optical waveguide writing technique, the WDM components can be integrated together with a coupling interface (such as node 114) to one or more optical fibers and a coupling interface to integrated circuit 112 (such as a silicon photonic chip) in one glass piece.

Figure 2:
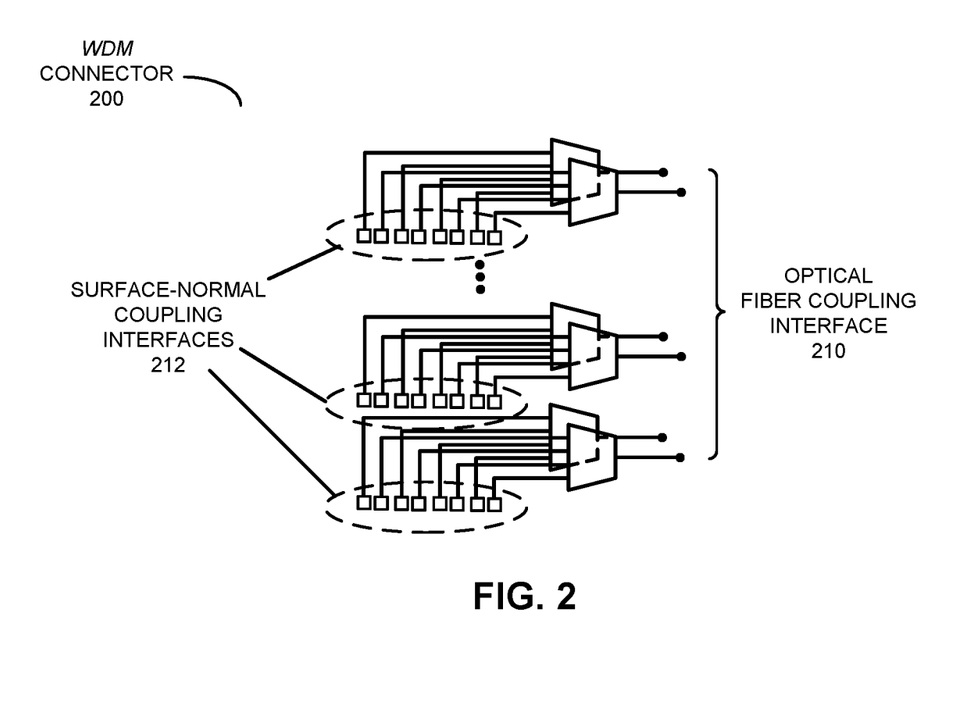
FIG. 2 is a block diagram illustrating a wavelength-division-multiplexer (WDM) connector for use in the transceiver of FIG. 1 in accordance with an embodiment of the present disclosure.

FIG. 2 presents a block diagram illustrating a WDM connector 200 for use in transceiver 100 (FIG. 1), such as integrated circuit 110 (FIG. 1). This WDM connector may include a 2×12 optical fiber coupling interface 210 to a standard 2×12 single-mode-fiber ferrule interface on one side, 12 pairs of 1×N multiplexers/demultiplexers inside the glass substrate, and two sets of 12×N surface-normal coupling interfaces 212 to a silicon-photonic chip on the bottom surface. Note that the capacity scaling of WDM connector 200 can be realized by increasing the multiplexer/demultiplexer channel counts.

Referring back to FIG. 1, transceiver 100 uses a two-carrier-wavelength WDM connector as an illustrative example. Note that only parallel optical links or paths may be needed on integrated circuit 112 (such as a silicon photonic chip) powered by optional optical sources 138 (such as laser sources) with two different wavelengths. At the transmitter, if one of optional optical sources 138 has output power to support more than one channel, its power can be shared by multiple channels using a power splitter (such as one of optional power splitters 140). The resulting optical signals are conveyed by optical waveguides 132 and modulated using modulators 136. (In FIG. 1, transmitter paths are shown solid lines, and receiver paths are shown as bold lines.) Then, the modulated optical signals are coupled to the WDM connector (i.e., integrated circuit 110) via SPGCs 124. The corresponding wavelength pair are then multiplexed using multiplexers (MUXs) 118 to one of optical waveguides 122 and eventually coupled to a corresponding optical fiber in a 2×12 mechanical transfer (MT) ferrule.

Moreover, at the receiver, the optical signals from the optical fibers are coupled to corresponding optical waveguides 122 of the glass WDM connector, separated by the integrated wavelength demultiplexers (DEMUXs) 120, and finally coupled to different receiving ports on the silicon-photonic chip (i.e., integrated circuit 112) via PSGCs 126. The optical signals are then conveyed by optical waveguides 132 to photodetectors 130.

Note that optical waveguides 122 and the other WDM components on the glass WDM connector are polarization insensitive. A given one of PSGCs 126 decomposes an arbitrary polarization from the single-mode optical fiber into two orthogonal polarization components, couples them into two transverse-electric silicon optical waveguides 132 and combines the power of these two components at a given one of photodetectors 130. Moreover, note that, by positioning demultiplexers 120 before PSGCs 126, the challenge of balancing the WDM optical paths for two non-constant polarization components is avoided.

In general, both broadband modulators (e.g., Mach-Zehnder interferometers or electro-absorption modulators) and wavelength-selective modulators (e.g., ring modulators) can be used in the transmitter. While a transceiver with only two carrier wavelengths is shown in FIG. 1, the bandwidth capacity can be scaled up for more wavelength channels by increasing the channel count of multiplexers 118 and demultiplexers 120 in the WDM connector, and using optional optical sources 138 (such as laser sources) with matching wavelengths. Because there is only one known carrier wavelength in each lane or optical path in integrated circuit 112, the grating couplers in single-polarization grating couplers (SPGCs) 124 and polarization-sensitive grating couplers (PSGCs) 126 can be fine-tuned to align with the carrier wavelength of a particular lane or optical path in advance (i.e., they can be designed to align with the carrier wavelength). Therefore, the narrow bandwidth of silicon grating couplers may no longer be an issue even for wideband embodiments with many WDM channels, and the remainder of the link implemented on integrated circuit 112 may be wavelength-agnostic.

Figure 3:
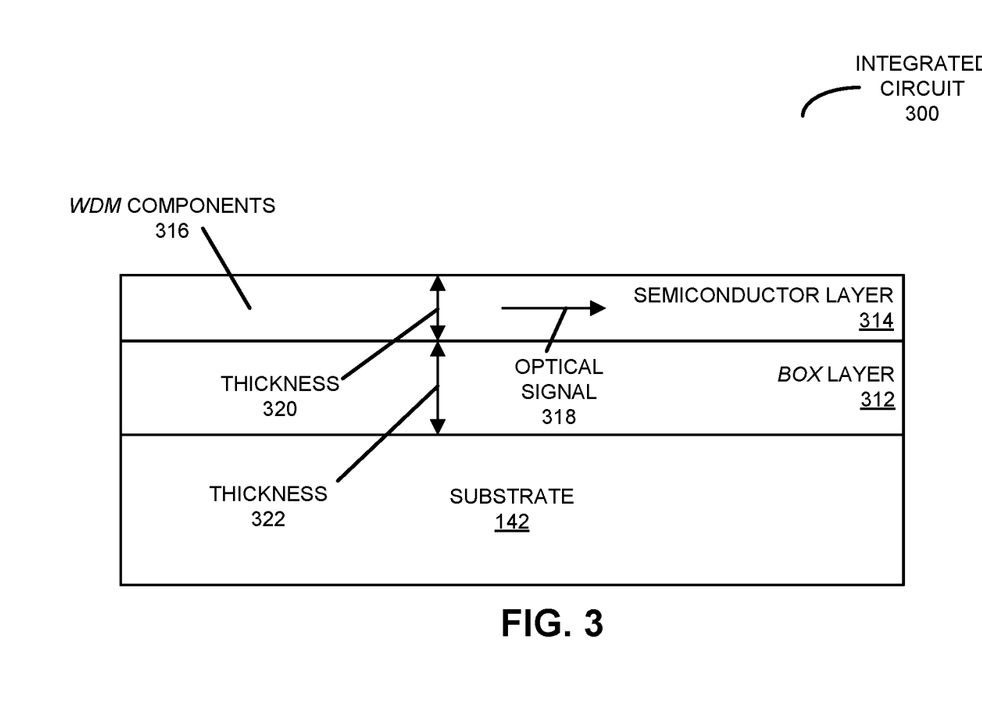
FIG. 3 is a drawing illustrating an integrated circuit for use in the transceiver of FIG. 1 in accordance with an embodiment of the present disclosure.

FIG. 3 presents a drawing illustrating an integrated circuit 300 for use in transceiver 100 (FIG. 1), such as integrated circuit 112 (FIG. 1). This integrated circuit includes: a substrate 142, a buried-oxide (BOX) layer 312 disposed on substrate 142, and a semiconductor layer 314 disposed on buried-oxide layer 312, where WDM components 316 in transceiver 100 (FIG. 1) that are less sensitive to temperature are implemented, at least in part, in semiconductor layer 314. Note that WDM components 316 (such as an optical waveguide) may convey an optical signal 318.

A wide variety of materials can be used in semiconductor layer 314 in integrated circuit 300; in an exemplary embodiment silicon is used. Furthermore, while a wide variety of materials may be used in substrate 142, such as a semiconductor, glass or plastic, in an exemplary embodiment silicon is used in substrate 142, along with silicon dioxide in buried-oxide layer 312. Consequently, in some embodiments, substrate 142, buried-oxide layer 312 and semiconductor layer 314 may comprise a silicon-on-insulator (SOI) technology or platform.

In an exemplary embodiment, optical signal 318 has a wavelength between 1.1-1.7 µm, such as an optical signal having a fundamental wavelength of 1.3 or 1.55 µm. Moreover, an optical waveguide in WDM components 316 may have a thickness 320 between 0.25 and 3 µm, and width between 0.5 and 3 µm. Note that because the optical waveguide may have a quasi-rectangular cross-section, it may be a quasi-single mode component. Moreover, buried-oxide layer 312 may have a thickness 322 between 0.3 and 3 µm.

Figure 4:
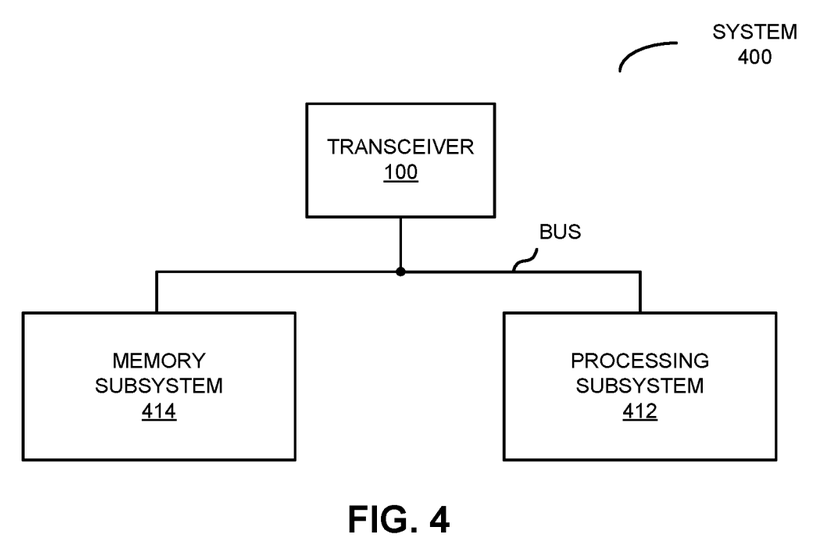
FIG. 4 is a block diagram illustrating a system that includes the transceiver of FIG. 1 in accordance with an embodiment of the present disclosure.

Transceiver 100 (FIG. 1) may be used in a variety of applications. This is shown in FIG. 4, which presents a block diagram illustrating a system 400 that includes transceiver 100, such as one of the preceding embodiments of the integrated circuit. In some embodiments, system 400 includes processing subsystem 412 (with one or more processors) and memory subsystem 414 (with memory).

In general, functions of transceiver 100 and system 400 may be implemented in hardware and/or in software. Thus, system 400 may include one or more program modules or sets of instructions stored in a memory subsystem 414 (such as DRAM or another type of volatile or non-volatile computer-readable memory), which, during operation, may be executed by a processing subsystem 412. Note that the one or more computer programs may constitute a computer-program mechanism. Furthermore, instructions in the various modules in memory subsystem 414 may be implemented in: a high-level procedural language, an object-oriented programming language, and/or in an assembly or machine language. Note that the programming language may be compiled or interpreted, e.g., configurable or configured, to be executed by the processing subsystem.

Components in system 400 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 400 may be at one location or may be distributed over multiple, geographically dispersed locations.

System 400 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, transceiver 100 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of transceiver 100 and/or system 400 may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, transceiver 100 and/or system 400 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the communication technique may be used with other materials (such as germanium and/or silicon germanium), as is known to one of skill in the art. Moreover, the semiconductor layer may include polysilicon or amorphous silicon. Furthermore, the materials and compounds in transceiver 100 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or transceiver 100.

Figure 5:
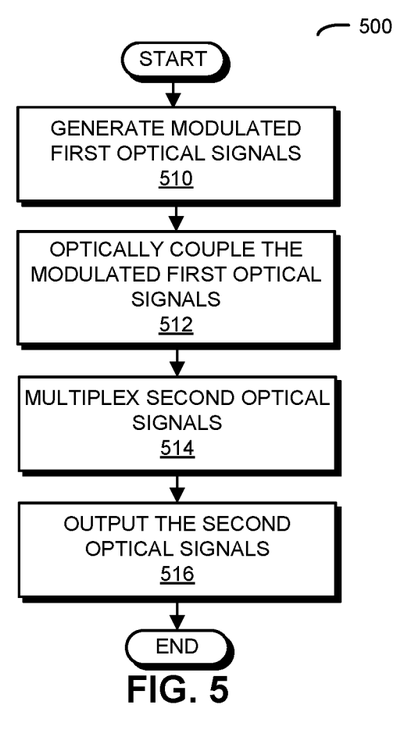
FIG. 5 is a flow diagram illustrating a method for transmitting optical signals in accordance with an embodiment of the present disclosure.

We now describe embodiments of a method for transmitting optical signals. FIG. 5 presents a flow chart illustrating a method 500 for transmitting optical signals using a transceiver, such as transceiver 100 (FIG. 1). During the method, optical components in multiple parallel optical paths in a second integrated circuit in the transceiver generate modulated first optical signals (operation 510), where a given optical path conveys a given modulated first optical signal having a given carrier wavelength. Then, the modulated first optical signals are optically coupled (operation 512) to a first integrated circuit in the transceiver. Moreover, WDM components that convey second optical signals having multiple carrier wavelengths in the first integrated circuit multiplex the optical signals (operation 514). Next, the second optical signals are output (operation 516) to an optical fiber. Note that the first integrated circuit includes a first substrate having a thermo-optic coefficient that is less than a threshold value, and the second integrated circuit includes a second substrate having a thermo-optic coefficient that is greater than the threshold value.

In some embodiments of method 500, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A transceiver, comprising:
a first integrated circuit that includes:
  a node that is configured to optically couple to one or more optical fibers;
  surface-normal couplers; and wavelength-division-multiplexing (WDM) components, between the node and the surface-normal couplers, that, during operation, convey optical signals having multiple carrier wavelengths, wherein the first integrated circuit includes a first substrate having a thermo-optic coefficient that is less than a threshold value; and
a second integrated circuit, optically coupled to the surface-normal couplers in the first integrated circuit, that includes multiple parallel optical paths with optical components, wherein, during operation, a given optical path conveys an optical signal having a given carrier wavelength, and
wherein the second integrated circuit includes a second substrate having a thermo-optic coefficient that is greater than the threshold value.

2. The transceiver of claim 1, wherein optical waveguides on the first substrate are polarization dependent and optical waveguides on the second substrate support a single polarization.

3. The transceiver of claim 1, wherein the first substrate includes glass.

4. The transceiver of claim 1, wherein the WDM components include multiplexers, demultiplexers, and optical waveguides.

5. The transceiver of claim 4, wherein the demultiplexers are optically coupled to polarization-splitting grating couplers on the second integrated circuit and the multiplexers are optically coupled to single-polarization grating couplers on the second integrated circuit.

6. The transceiver of claim 1, wherein the optical components on the second substrate include photodetectors, optical waveguides, modulators, single-polarization grating couplers optically coupled to the modulators and the surface-normal couplers, and polarization-splitting grating couplers optically coupled to the photodetectors and the surface-normal couplers.

7. The transceiver of claim 6, wherein the optical components include optical sources.

8. The transceiver of claim 7, wherein the optical components include power splitters.

9. The transceiver of claim 1, wherein second integrated circuit comprises:
the second substrate;
a buried-oxide layer disposed on the second substrate; and
a semiconductor layer disposed on the buried-oxide layer, wherein the optical components are defined, at least in part, in the semiconductor layer.

10. The transceiver of claim 9, wherein the second substrate includes silicon, the buried-oxide layer includes silicon dioxide, and the semiconductor layer includes silicon.

11. A system, comprising:
a processor;
a memory, coupled to the processor, which stores a program module, and which, during operation, is executed by the processor; and
a transceiver, wherein the transceiver comprises:
  a first integrated circuit that includes:
    a node that is configured to optically couple to one or more optical fibers;
    surface-normal couplers; and
    wavelength-division-multiplexing (WDM) components, between the node and the surface-normal couplers, that, during operation, convey optical signals having multiple carrier wavelengths, wherein the first integrated circuit includes a first substrate having a thermo-optic coefficient that is less than a threshold value; and
  a second integrated circuit, optically coupled to the surface-normal couplers in the first integrated circuit, that includes multiple parallel optical paths with optical components, wherein, during operation, a given optical path conveys an optical signal having a given carrier wavelength, and
  wherein the second integrated circuit includes a second substrate having a thermo-optic coefficient that is greater than the threshold value.

12. The system of claim 11, wherein optical waveguides on the first substrate are polarization dependent and optical waveguides on the second substrate support a single polarization.

13. The system of claim 11, wherein the first substrate includes glass.

14. The system of claim 11, wherein the WDM components include multiplexers, demultiplexers, and optical waveguides.

15. The system of claim 14, wherein the demultiplexers are optically coupled to polarization-splitting grating couplers on the second integrated circuit and the multiplexers are optically coupled to single-polarization grating couplers on the second integrated circuit.

16. The system of claim 11, wherein the optical components on the second substrate include photodetectors, optical waveguides, modulators, single-polarization grating couplers optically coupled to the modulators and the surface-normal couplers, and polarization-splitting grating couplers optically coupled to the photodetectors and the surface-normal couplers.

17. The system of claim 16, wherein the optical components include optical sources.

18. The system of claim 11, wherein the second integrated circuit comprises:
the second substrate;
a buried-oxide layer disposed on the second substrate; and
a semiconductor layer disposed on the buried-oxide layer, wherein the optical components are defined, at least in part, in the semiconductor layer.

19. The system of claim 18, wherein the second substrate includes silicon, the buried-oxide layer includes silicon dioxide, and the semiconductor layer includes silicon.

20. A method for transmitting optical signals, the method comprising:
generating modulated first optical signals using optical components in multiple parallel optical paths in a second integrated circuit, wherein a given optical path conveys a given modulated first optical signal having a given carrier wavelength, and
wherein the second integrated circuit includes a second substrate having a thermo-optic coefficient that is greater than a threshold value;
optically coupling the modulated first optical signals to a first integrated circuit;
multiplexing the optical signals in the first integrated circuit using wavelength-division-multiplexing (WDM) components that convey second optical signals having multiple carrier wavelengths, wherein the first integrated circuit includes a first substrate having a thermo-optic coefficient that is less than the threshold value; and
outputting the second optical signals to one or more optical fibers.

* * * * *